(12) United States Patent
Shako et al.

(10) Patent No.: US 7,564,921 B2
(45) Date of Patent: Jul. 21, 2009

(54) DC OFFSET CORRECTION APPARATUS AND METHOD

(75) Inventors: Hideharu Shako, Kawasaki (JP); Yasuhito Funyu, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/016,354

(22) Filed: Jan. 18, 2008

(65) Prior Publication Data

US 2008/0111723 A1 May 15, 2008

Related U.S. Application Data

(63) Continuation of application No. PCT/JP2005/015164, filed on Aug. 19, 2005.

(51) Int. Cl.
H04L 25/03 (2006.01)

(52) U.S. Cl. .................................................. 375/296

(58) Field of Classification Search ................ 375/285, 375/295–297; 332/107, 123, 159; 455/50.1, 455/63.1, 91, 114.2, 114.3
See application file for complete search history.

(56) References Cited

U.S. PATENT DOCUMENTS

| 5,959,500 | A | * | 9/1999 | Garrido ...................... 330/151 |
| 5,990,734 | A | * | 11/1999 | Wright et al. .................. 330/2 |
| 2001/0010713 | A1 | | 8/2001 | Yamamoto |
| 2002/0151289 | A1 | * | 10/2002 | Rahman et al. .......... 455/232.1 |
| 2007/0110183 | A1 | | 5/2007 | Nagatani et al. |
| 2007/0176806 | A1 | * | 8/2007 | Ohba et al. ................. 341/118 |

FOREIGN PATENT DOCUMENTS

| JP | 2001-285387 | 10/2001 |
| JP | 2001-339452 | 12/2001 |
| WO | 2005/025167 | 3/2005 |
| WO | 2005/025168 | 3/2005 |

OTHER PUBLICATIONS

International Search Report dated Nov. 8, 2005, from the corresponding International Application.
Notice of Rejection Ground dated Sep. 2, 2008, from the corresponding Japanese Application.

* cited by examiner

Primary Examiner—Tesfaldet Bocure
(74) Attorney, Agent, or Firm—Katten Muchin Rosenman LLP

(57) ABSTRACT

A reference signal and a feedback signal are written to memory and the state of a power value of a reference signal is used for judging whether the current signal is in a normal state, burst state, non-modulation state or no-wave transmission state. If the state is judged to be the burst state or no-wave transmission state, a DC offset correction is performed by selecting a feedback signal type DC offset correction method in which a DC offset is corrected by using only a feedback signal. If the state is judged to be the normal state or non-modulation state, a DC offset correction is performed by selecting a reference signal type DC offset correction method in which a DC offset is corrected by using a differential signal between the reference signal and feedback signal.

7 Claims, 10 Drawing Sheets

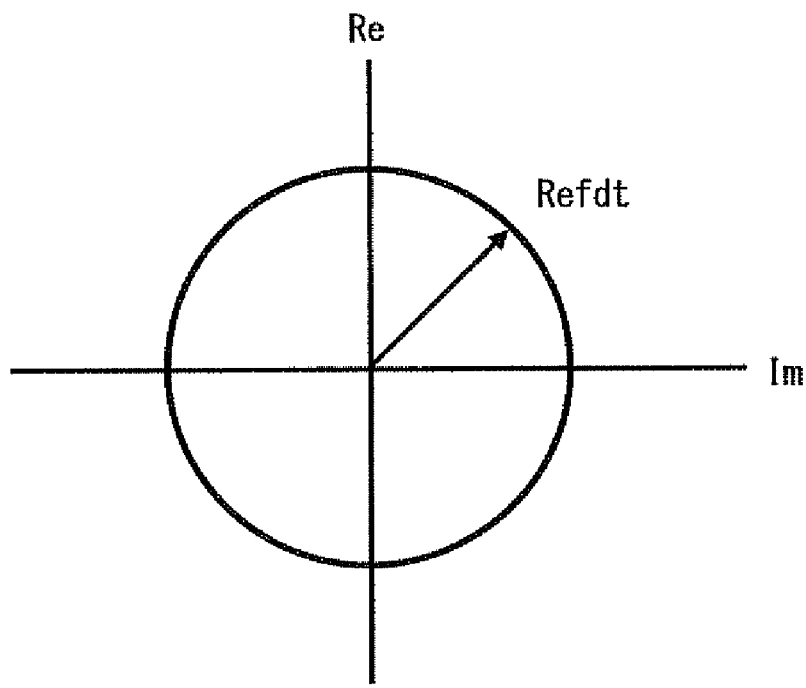
F I G. 2A
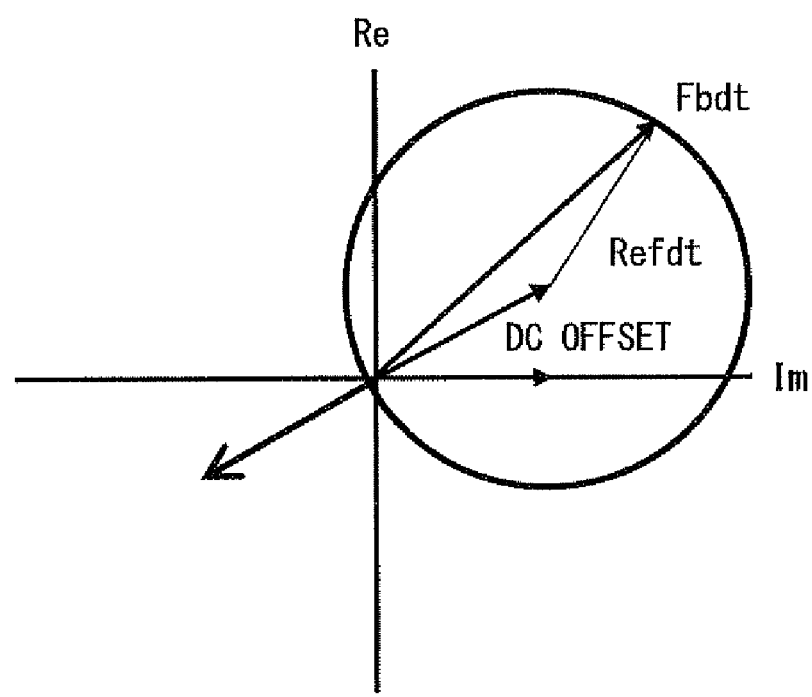
F I G. 2B

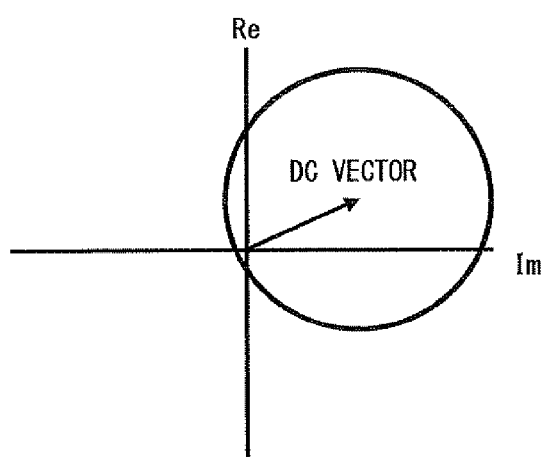
F I G. 3A
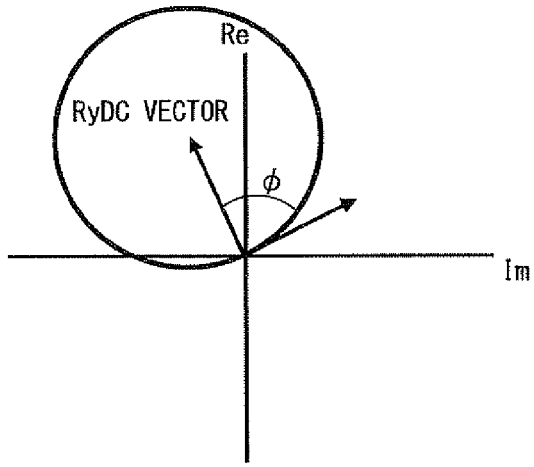
F I G. 3B
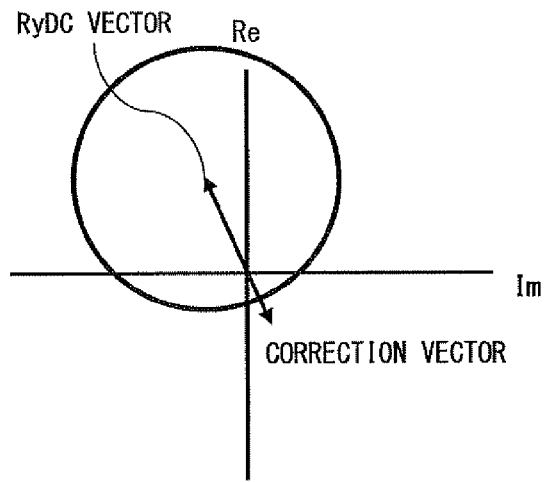
F I G. 3C
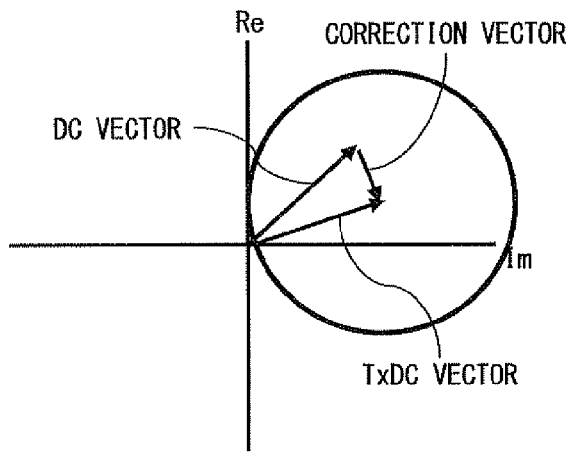
F I G. 3D
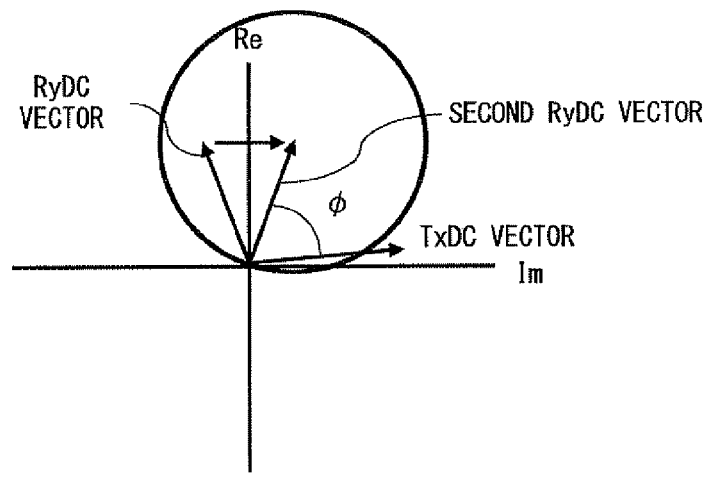
F I G. 3E

| | NORMAL STATE<br>· THE STATE OF TRANSMITTING MODULATION WAVE | NON-MODULATION WAVE STATE<br>· THE STATE OF TRANSMITTING ONLY NON-MODULATION WAVE | BURST STATE<br>· THE STATE OF "0" AMPLITUDE OCCURS AT TIMES | NO-WAVE TRANSMISSION STATE<br>· THE STATE OF NO CARRIER EXISTING |
|---|---|---|---|---|
| FEEDBACK SIGNAL TYPE DC OFFSET | THIS IS NOT USED BECAUSE THE CORRECTION ACCURACY IS DEGRADED IF THE LOCAL LEAKAGE CONCEALED UNDER A CARRIER | THIS IS NOT USED BECAUSE A NON-MODULATION WAVE IS UNNECESSARILY CORRECTED IF THE CARRIER FREQUENCY AND LOCAL LEAKAGE ARE THE SAME | THIS IS USED | THIS IS USED |
| REFERENCE SIGNAL TYPE DC OFFSET | THIS IS USED | THIS IS USED. IF THE PHASE IS ROTATED, IT IS ACCEPTABLE IN NON-MODULATION | THIS IS NOT USED BECAUSE THERE IS A CASE OF INCAPABILITY TO ADJUST A PHASE | THERE IS NO REFERENCE SIGNAL DUE TO NO-WAVE TRANSMISSION STATE |

FIG. 8

DC OFFSET CORRECTION APPARATUS AND METHOD

CROSS REFERENCE TO RELATED APPLICATION

This application is a continuation of PCT application PCT/JP2005/015164 filed on Aug. 19, 2005.

BACKGROUND OF THE INVENTION

1. Field of the Invention

The present invention relates to an apparatus and a method for correcting a DC component generated by an orthogonal converter in a radio telecommunication apparatus.

2. Description of the Related Art

FIG. 1 is a diagram describing local leakage.

In an amplifier for use in a radio telecommunication apparatus employing a direct modulation method, local leakage is generated by a direct current (DC) component (i.e., a DC offset) that is generated at a digital/analog (D/A) converter and a modulator. The local leakage is a spurious wave and therefore must be reduced in order to attain good quality telecommunications. To reduce the local leakage, it is necessary to have a function for providing an offset voltage (i.e., a DC offset correction circuit) so as to cancel a DC offset generated at a converter. The amount of the DC offset generated at a converter is varied in accordance with temperature and the amplitude of input I and Q signals; therefore, it is desirable that the DC offset be cancelled adaptively by updating the parameter of a DC offset correction circuit at the time a radio telecommunication apparatus is operated. Accordingly, an apparatus is implemented in which a central processing unit (CPU) calculates a DC component by using reference signal data or feedback signal data to update the parameter of the DC offset correction circuit adaptively, thereby reducing local leakage even if the temperature and/or IQ amplitude value change.

Two methods are known as conventional methods for correcting a DC offset.

FIGS. 2A and 2B are diagrams describing a reference signal type DC offset correction method.

The correction of a reference signal type DC offset uses a feedback signal that is the result of demodulating the output of an amplifier to an IQ signal by way of a feedback circuit and a reference signal that is a pre-modulation baseband signal. The method involves subtracting the reference signal from the feedback signal, calculating a parameter in a reverse phase by using an error signal that is the result of extracting only a DC offset component of a transmission signal, and updating the parameter of the DC offset correction circuit, thereby removing the DC offset. Prior to this operation, it is necessary to perform a phase adjustment operation on the feedback signal and reference signal in order to match the signal point phase between the reference signal and feedback signal.

Now, let it be assumed that a vector indicating the reference signal is expressed by "Refdt" as shown in FIG. 2A and that a vector indicating the feedback signal is expressed by "Fbdt" as shown in FIG. 2B. The DC offset generated by the converter and/or D/A converter are added to the Fbdt. Further assuming that the phases of the Refdt and Fbdt are matched with each other by the operation of phase adjustment, and subtraction of the Refdt from the Fbdt that has a DC offset added to it obtains a vector indicating the DC offset because the Refdt is a signal in the state of a DC offset not existing. Therefore, the vector indicating the DC offset that is obtained by an arithmetic logical operation is previously subtracted from the Refdt and then D/A conversion and modulation are applied, thereby obtaining an amplifier output that is the result of reducing the DC offset.

FIGS. 3A through 3E are diagrams describing a feedback signal type DC offset correction method.

The feedback signal type DC offset correction method corrects a DC offset by using only a feedback signal. In this method, a CPU evaluates the vector direction of a DC offset and sets a parameter, which comprises discretionary amplitude in the reverse direction to the evaluated vector direction, in the DC offset correction circuit, thereby cancelling the DC offset. Actually, however, the rotation of a local phase on the frequency converter used in a feedback circuit causes a shift between the vector direction of the DC offset evaluated by the CPU and the actual vector direction. The CPU accordingly performs a discretionary correction, examines how much the amount of rotation of the local phase has affected the feedback signal, and evaluates the vector direction of the DC offset in consideration of the value of the effect.

FIG. 3A is a DC vector that is the result of adding a DC offset to a baseband signal vector. FIG. 3B is a transmission signal vector (i.e., an RxDC vector) that is the result of adding a phase rotation φ to the DC vector. A correction vector that cancels the RxDC vector is generated by rotating the RxDC vector by 180 degrees and multiplying it by an arbitrary constant, as shown in FIG. 3C. Then a TxDC vector is obtained as a result of adding the correction vector to the DC vector, as shown in FIG. 3D. A vector that is the result of rotating the TxDC vector in the amount of the phase φ is a second RxDC vector, as shown in FIG. 3E. The second RxDC vector is a vector that is the result of adding the correction vector to the baseband signal, modulating it after a D/A conversion, and then feeding it back. Therefore, the difference between the RxDC vector shown in FIG. 3B and the second RxDC vector shown in FIG. 3E is a vector that is the result of rotating the phase of the correction vector. Then, a comparison between the differential vector and the initial correction vector obtains a phase rotation amount φ. Therefore, the method is such that, when the correction vector is added to the RxDC vector, a correction vector that is the result of adding the phase correction in the amount of the phase rotation is added to the baseband signal. As a result, the DC offset is corrected to some extent. This is followed by changing the magnitude of the correction vector step by step so that the signal points distribute around the origin of the IQ plane, thus resulting in cancellation of the DC offset.

The characteristics of the feedback signal type DC offset correction method are listed as follows:

Not using a reference signal eliminates the necessity of performing a phase adjustment;

if an un-modulated wave and a local leakage are the same frequency, the amplitude of the un-modulated wave is also cancelled because the amplitude of the un-modulated wave cannot be distinguished from a DC offset; and if the frequency of the local leakage exists in the modulation band of a carrier, this makes it difficult to extract a DC component, resulting in degradation of the correction accuracy.

The characteristics of the reference signal type DC offset correction method are listed as follows:

A DC offset is extracted from the error component between the reference signal and feedback signal, making it possible to extract a DC component even if the frequency of the DC offset overlaps with the modulation band of a carrier, thereby making the correction accuracy high; and for a transmission pattern in which zero amplitude occurs frequently at a burst transmission or the like, a phase adjustment cannot be performed normally, and as a result a DC offset component cannot be extracted and therefore a DC offset correction cannot be achieved.

The above noted DC offset correction methods are detailed in reference patent documents 1 and 2:

Patent document 1: International Disclosure Number WO2005/025167 A1

Patent document 2: International Disclosure Number WO2005/025168 A1

SUMMARY OF THE INVENTION

The purpose of the present invention is to provide a DC offset correction apparatus capable of correcting a DC offset adequately even if there is a difficulty in correcting it by using a single DC offset correction method.

A direct current (DC) offset correction apparatus according to the present invention modulates by using a baseband signal and a reference signal that is the result of giving an appropriate delay to the baseband signal, feeding back a signal amplified by an amplifier, generating a demodulated feedback signal, and correcting a DC offset of a transmission signal, comprising: a signal state evaluation unit for evaluating the state of a transmitted signal by examining the reference signal; and a DC offset correction unit for selecting, on the basis of the result of evaluating the signal state, either a first method for correcting the DC offset of a transmission signal by using only the feedback signal or a second method for correcting the DC offset of the transmission signal by using both the reference signal and feedback signal, and correcting the DC offset of the transmission signal.

BRIEF DESCRIPTION OF THE DRAWINGS

FIGS. 2A and 2B are diagrams describing a reference signal type DC offset correction method;

FIGS. 3A through 3E are diagrams describing a feedback signal type DC offset correction method;

FIG. 8 is a diagram showing a selection judgment method for a DC offset correction method;

DESCRIPTION OF THE PREFERRED EMBODIMENTS

A preferred embodiment of the present invention is configured to use a feedback signal type DC offset correction and a reference signal type DC offset correction as methods for correcting a DC offset; and in particular, to analyze the signal pattern of a reference signal and select a more appropriate method to perform a correction. Further, due to the nature of the calculation of a DC offset in which the calculation is performed by accumulating an instantaneous value in memory, there are rare cases of the calculation result indicating an abnormal value caused by a noise component overlapping with the data, or a similar cause. In such cases, the abnormal parameter value is kept minimal at the time of miscalculation by setting a limiter value for the calculated value in order to prevent the parameter from being configured to an abnormal value.

Figure 1:
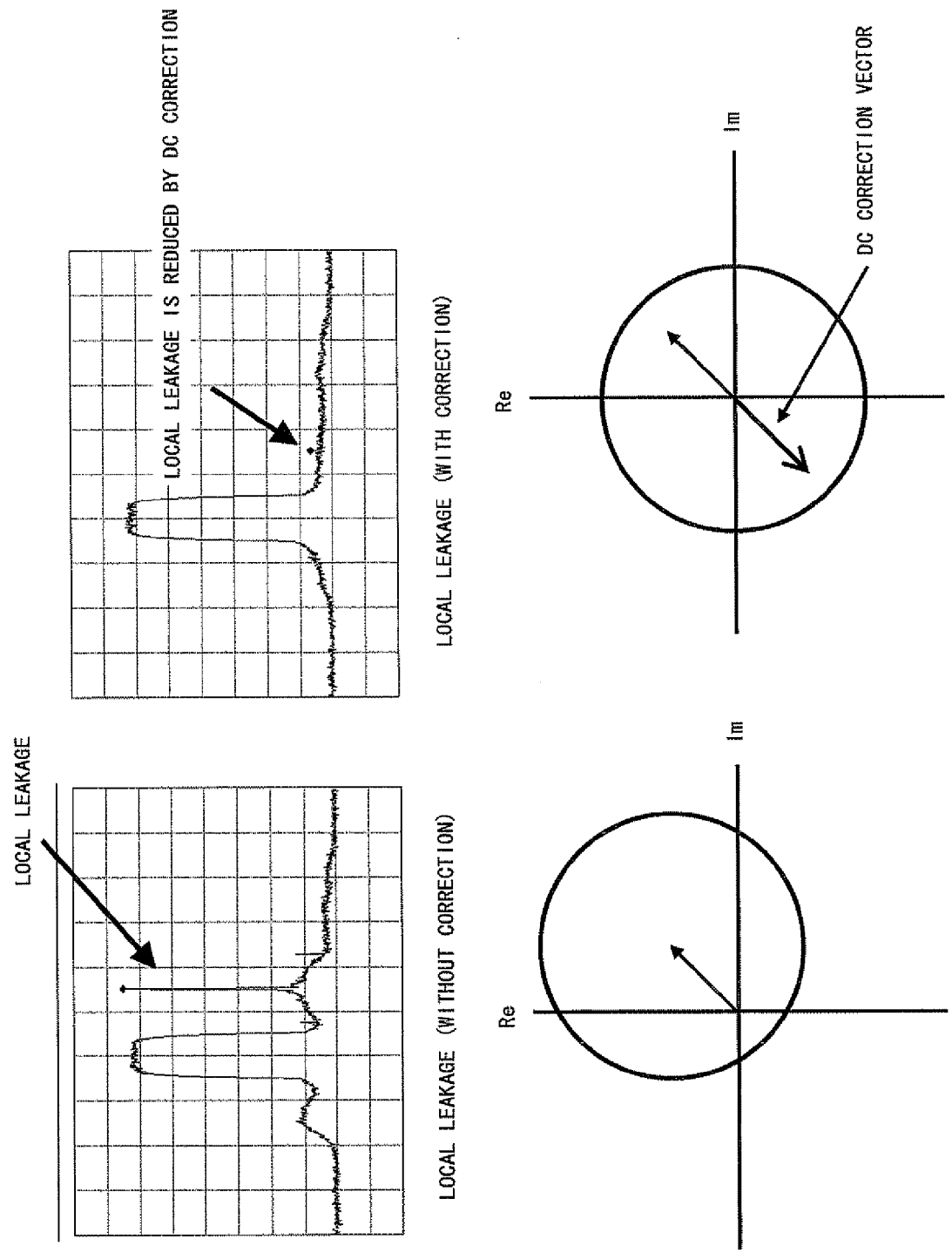
FIG. 1 is a diagram describing a local leakage.
Figure 4:
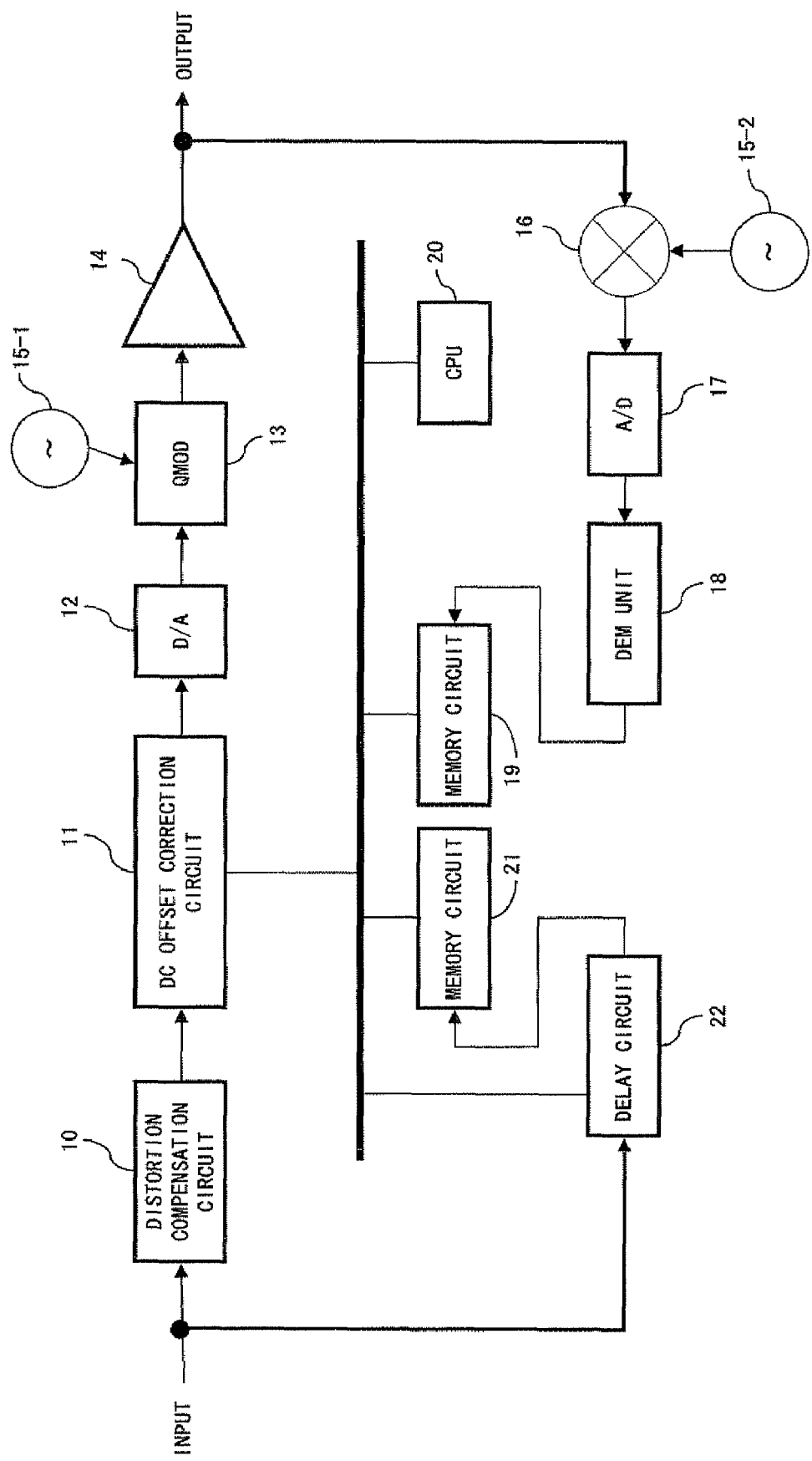
FIG. 4 is a diagram exemplifying the configuration of a DC offset correction circuit.

FIG. 4 is a diagram exemplifying the configuration of a DC offset correction circuit.

An input signal that is a baseband signal is given a delay by a delay circuit 22 and the result is stored in a memory circuit 21. This signal is the reference signal. The input signal is also compensated for distortion by a distortion compensation circuit 10, then undergoes a correction process for a DC offset by a DC offset correction circuit 11, then is converted into an analog signal from the digital signal by a D/A converter 12, and then is modulated by an orthogonal converter 13. A local oscillator 15-1 is equipped to supply a carrier wave in an orthogonal modulation. A DC offset is added to the signal mainly as a result of the signal passing through the D/A converter 12 and orthogonal converter 13. The output of the orthogonal converter 13 is amplified by an amplifier 14 and is then output.

The output of the amplifier 14 is fed back, multiplied with the oscillation wave of a local oscillator 15-2 by a multiplier 16, and down-converted. The resultant is then converted from the analog signal into a digital signal by an A/D converter 17, and then demodulated by a demodulator (DEM unit) 18. The demodulated signal is stored in a memory circuit 19.

A CPU 20 reads, and processes, the feedback signal and reference signal respectively from the memory circuits 19 and 21 properly. Then the CPU 20 obtains a DC offset correction vector and gives it to the DC offset correction circuit 11.

Figure 5:
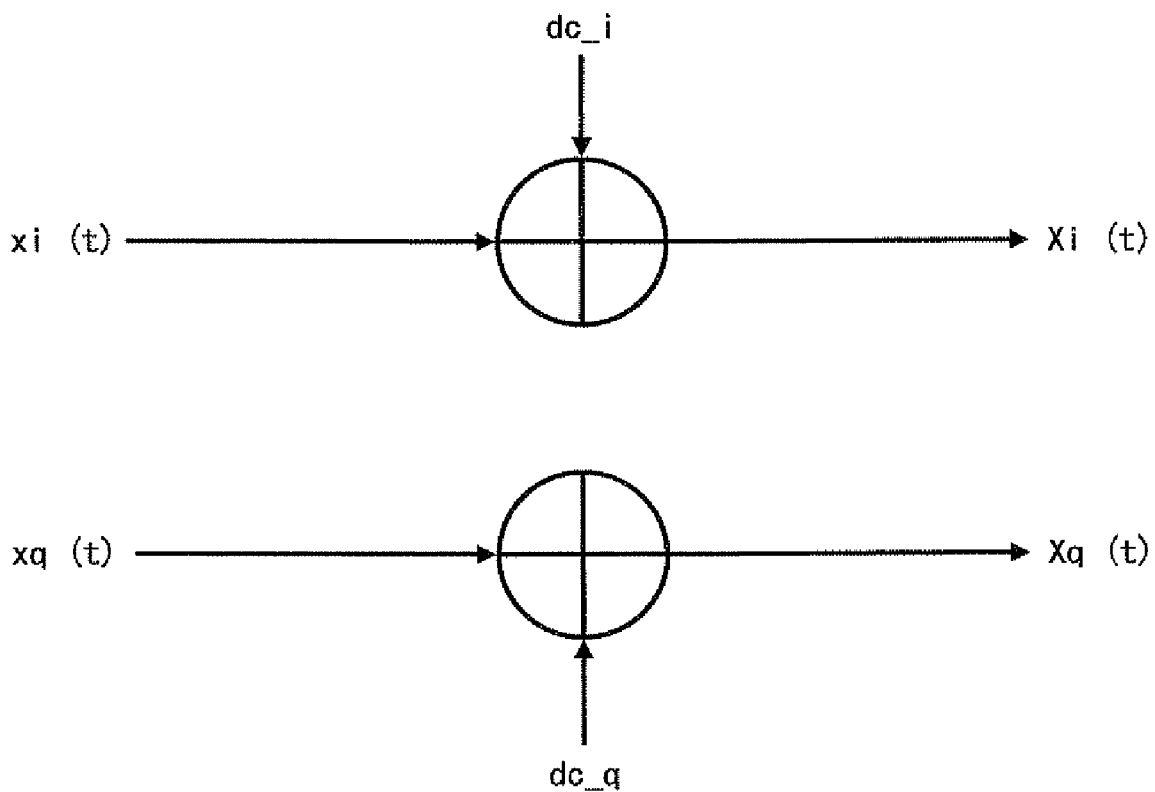
FIG. 5 is a diagram showing a DC offset correction circuit.

FIG. 5 is a diagram showing a DC offset correction circuit.

An input I signal to the circuit is indicated by xi, xq is an input Q signal thereto, Xi is an output I signal from the circuit, and Xq is an output Q signal therefrom.

Letting the I component and Q component of a DC offset be Idc and Qdc, respectively, the DC offset is corrected by setting dc_i and dc_q so as to make:

$$Idc+dc\_i=0 \text{ and } Qdc+dc\_q=0$$

Figure 6:
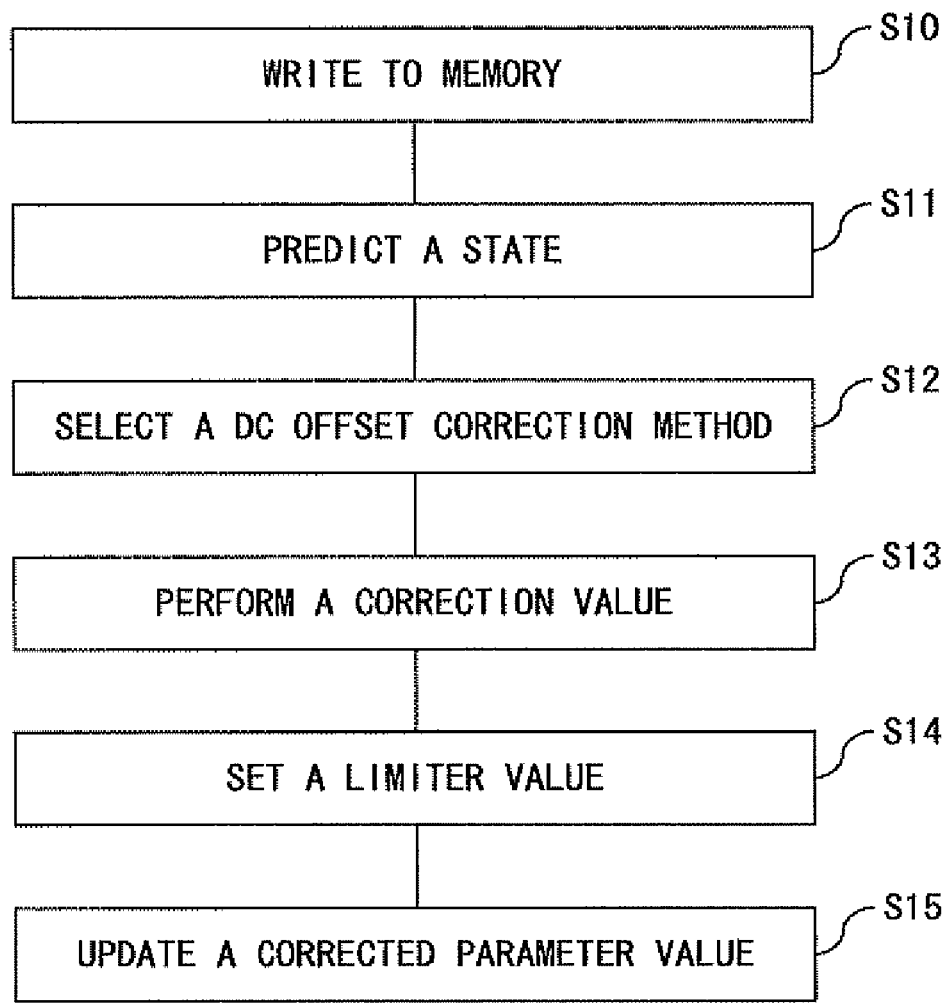
FIG. 6 is a flow chart showing a sequence for correcting a DC offset according to a preferred embodiment of the present invention.

FIG. 6 is a flow chart showing a sequence for correcting a DC offset according to a preferred embodiment of the present invention.

First, a reference signal and a feedback signal are written respectively to the memory circuits 21 and 19 in step S10. The current state of the signal is evaluated from the input data of the reference signal in step S11. In step S12, a correction method for a DC offset is selected on the basis of the signal state evaluated in step S11. The present embodiment is configured to select either a feedback signal type DC offset correction method or a reference signal type DC offset correction method. A correction value is calculated in step S13 and, if the calculated value is no smaller than a limiter value, the calculated value is judged to be abnormal and is ignored, and the limiter value is determined to be the correction value in step S14. If the calculated value is smaller than the limiter value, the calculated value is used as the correction value. In step S15, the corrected parameter value is updated and set.

Figure 7A:
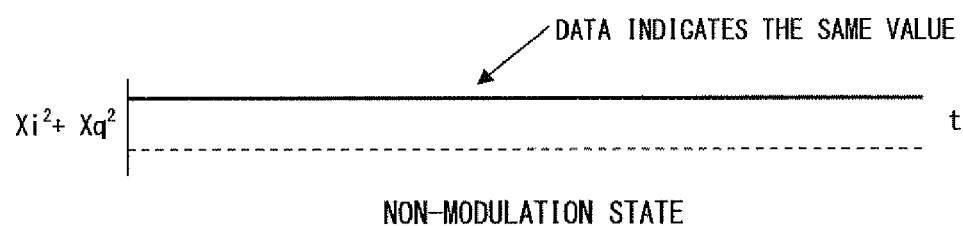
FIGS. 7A and 7B are diagrams describing a signal state evaluation method.
Figure 7B:
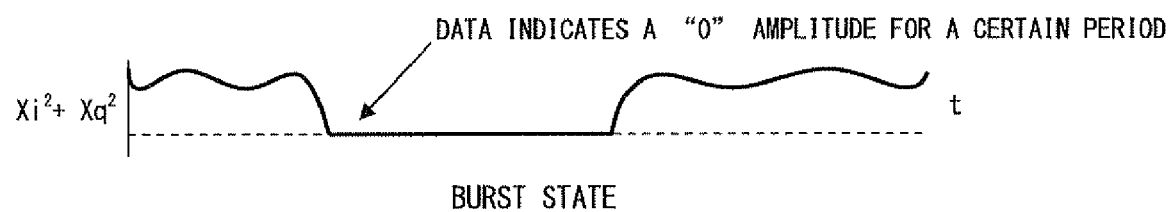

FIGS. 7A and 7B are diagrams describing a signal state evaluation method.

A signal state is evaluated by the CPU 20 examining a reference signal stored in the memory circuit 21.

In the case of a non-modulation state such as that shown in FIG. 7A, a power value that is the sum of squares of the I component Xi and Q component Xq of the signal constitutes a constant value. The power value is observed for a prescribed time period and, if the power value continues to be at a constant value, the state is judged to be a non-modulation state. Meanwhile, in the case of a burst state as shown in FIG. 7B, the data indicates a "0" amplitude for a certain period of time. Therefore, if such a "0" amplitude continues for no less than the certain period, the state is judged to be a burst state.

Further, in the case of no-wave transmission, the data of the reference signal is fixed to "0" and therefore the state is judged to be a no-wave transmission state.

FIG. 8 is a diagram showing a selection judgment method for a DC offset correction method.

As shown in FIG. 8, use of the feedback signal type DC offset correction method degrades the correction accuracy if the local leakage is concealed within the transmission frequency band of a carrier, and therefore the reference signal type DC offset correction method is used instead. In a non-modulation wave state, use of the feedback signal type DC offset correction method results in the amplitude of a non-modulation carrier being corrected unnecessarily if the carrier frequency and local leakage are the same frequency, and therefore the reference signal type DC offset correction method is used instead. In a burst state, the reference signal type DC offset correction method is incapable of performing an accurate correction because phase adjustment is impossible at the "0" amplitude point of transmission data. Therefore, the feedback signal type DC offset correction method is used in the burst state. There is no reference signal in a no-wave transmission state, and therefore the feedback signal type DC offset correction method is used.

The above described judgment method is carried out by the CPU 20.

Figure 9:
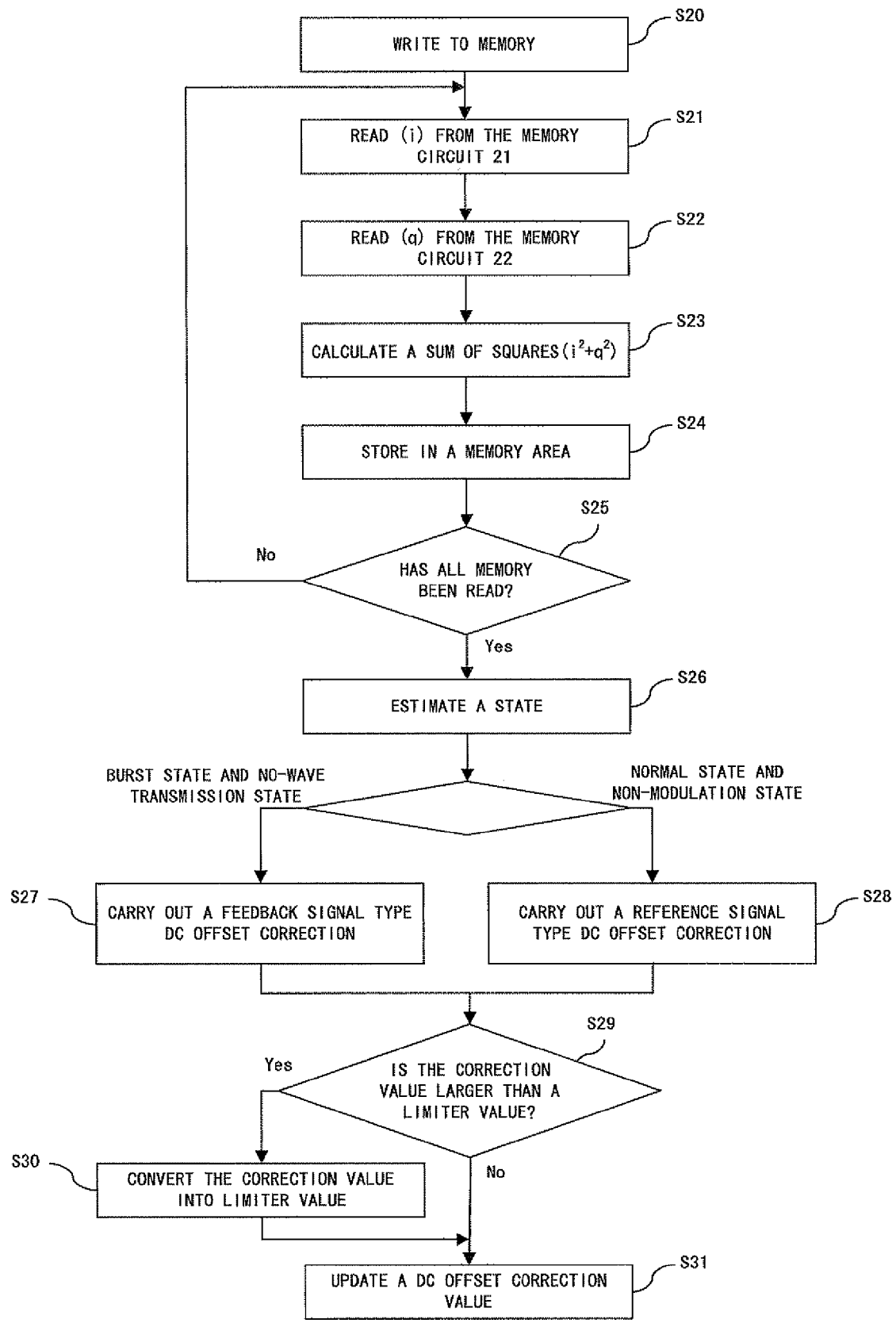
FIG. 9 is a flow chart of a process executed by a CPU 20 (part 1)
Figure 10:
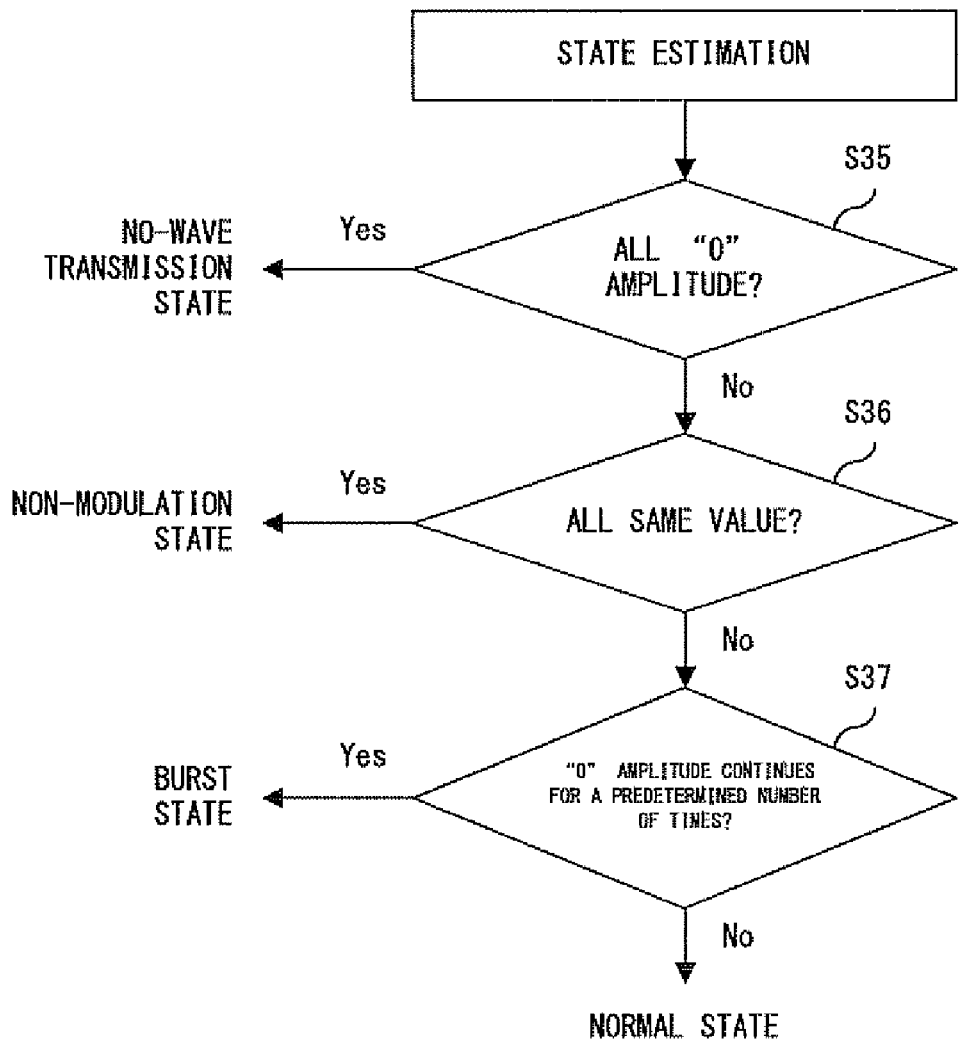
FIG. 10 is a flow chart of a process executed by the CPU 20 (part 2).

FIGS. 9 and 10 are flow charts of a process executed by the CPU 20.

First, the reference signal and feedback signal are respectively written to the memory circuits 21 and 19 in step S20. The I component of the reference signal is read from the memory circuit 21 in step S21. The Q component of the reference signal is read from the memory circuit 21 in step S22. The sum of the squares of the readout I component and Q component is calculated in step S23. The calculated sum of the squares is stored in a memory area of the memory circuit 21 in step S24. Whether or not all data of the reference signal stored in the memory circuit 21 has been read is judged in step S25. If the judgment of step S25 is "no", the process returns to step S21 to repeat the process described above. If the judgment of step S25 is "yes", the state of a signal is evaluated on the basis of the value of the calculated sum of squares in step S26. If a judgment is that the state is a normal state or a non-modulated state as a result of the evaluation of the signal state, a correction value is obtained by carrying out a reference signal type DC offset correction in step S28, followed by the process proceeding to step S29. If the judgment is that the state is a burst state or is a no-wave transmission state as a result of the evaluation of the signal state, a correction value is obtained by carrying out a feedback signal type DC offset correction in step S27, followed by proceeding to step S29. Whether or not the correction value is larger than a limiter value is judged in step S29. If the judgment of step S29 is "no", the process proceeds to step S31. If the judgment of step S29 is "yes", the correction value is replaced with the limiter value in step S30, followed by proceeding to step S31. The DC offset correction value is updated in step S31. With this method, a DC offset correction is carried out with a new correction.

FIG. 10 is a flow chart showing in detail the state evaluation process shown in FIG. 9.

Whether or not the amplitudes of all signals are "0" is judged by detecting the sum of the squares in step S35. If the judgment of step S35 is "yes", the state is evaluated to be a no-wave transmission state. If the judgment of step S35 is "no", whether or not the sums of the squares for all signals are the same value is judged in step S36. If the judgment of step S36 is "yes", the state is evaluated to be a non-modulation wave state. If the judgment of step S36 is "no", whether or not a "0" amplitude state continues for a predetermined number of times is judged in step S37. If the judgment of step S37 is "yes", the state is evaluated to be a burst state. If the judgment of step S37 is "no", the state is evaluated to be a normal state.

What is claimed is:

1. A direct current (DC) offset correction apparatus modulating by using a baseband signal and a reference signal that is the result of giving an appropriate delay to the baseband signal, feeding back a signal amplified by an amplifier, generating a demodulated feedback signal and correcting a DC offset of a transmission signal, comprising:
    a signal state evaluation unit for evaluating a state of a transmitted signal by examining the reference signal; and
    a DC offset correction unit for selecting, on the basis of the result of evaluating the signal state, either a first method for correcting the DC offset of a transmission signal by using only the demodulated feedback signal or a second method for correcting the DC offset of the transmission signal by using both the reference signal and the demodulated feedback signal, and correcting the DC offset of the transmission signal.

2. The DC offset correction apparatus according to claim 1, wherein
    said signal state evaluation unit evaluates a state of a signal by using a power value of said reference signal.

3. The DC offset correction apparatus according to claim 1, wherein
    said signal state evaluation unit evaluates whether a transmission signal is in a state of a normal transmission, a state of transmitting a burst signal, a state of transmitting a non-modulation wave, or a state of no-wave transmission.

4. The DC offset correction apparatus according to claim 3, performing
    a correction process for a DC offset by using said first method if said transmission signal is in a state of transmitting a burst signal or a state of no-wave transmission.

5. The DC offset correction apparatus according to claim 3, performing
    a correction process for a DC offset by using said second method if said transmission signal is in a state of a normal transmission or a state of transmitting a non-modulation wave.

6. The DC offset correction apparatus according to claim 1, performing
    a correction process for a DC offset by replacing a correction value with a predetermined value if the correction value becomes larger than a prescribed value when the DC offset of said transmission signal is corrected.

7. A direct current (DC) offset correction method for modulating by using a baseband signal and a reference signal that is the result of giving an appropriate delay to the baseband signal, feeding back a signal that is the result of an amplifier amplifying, generating a demodulated feedback signal, and correcting a DC offset of a transmission signal, comprising:

evaluating a state of a transmitted signal by examining the reference signal; and selecting, on the basis of the result of evaluating the signal state, either a first method for correcting the DC offset of a transmission signal by using only the demodulated feedback signal or a second method for correcting the DC offset of the transmission signal by using both the reference signal and the demodulated feedback signal, and correcting the DC offset of the transmission signal.

* * * * *